United States Patent
Deng et al.

(10) Patent No.: US 10,666,292 B2
(45) Date of Patent: May 26, 2020

(54) COMPRESSING METHOD OF A GRAYSCALE COMPENSATION TABLE OF AN OLED DISPLAY PANEL

(71) Applicant: Shenzhen China Star Optoelectronics Semiconductor Display Technology Co., Ltd., Shenzhen (CN)

(72) Inventors: Yufan Deng, Guangdong (CN); Mingjong Jou, Guangdong (CN); Shensian Syu, Guangdong (CN); Ronggang Wang, Guangdong (CN); Kui Fan, Guangdong (CN); Hao Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 194 days.

(21) Appl. No.: 15/744,809

(22) PCT Filed: Nov. 30, 2017

(86) PCT No.: PCT/CN2017/113685
§ 371 (c)(1),
(2) Date: Jan. 14, 2018

(87) PCT Pub. No.: WO2019/085112
PCT Pub. Date: May 9, 2019

(65) Prior Publication Data
US 2019/0132001 A1 May 2, 2019

(30) Foreign Application Priority Data
Nov. 2, 2017 (CN) .......................... 2017 1 1066079

(51) Int. Cl.
*H03M 7/30* (2006.01)
*G09G 3/3208* (2016.01)

(52) U.S. Cl.
CPC ........ *H03M 7/6011* (2013.01); *G09G 3/3208* (2013.01); *H03M 7/30* (2013.01); *H03M 7/3071* (2013.01); *G09G 2310/027* (2013.01)

(58) Field of Classification Search
CPC ......... G09G 3/3208; G09G 2320/0285; G09G 2350/00; H03M 7/6011
See application file for complete search history.

(56) References Cited

U.S. PATENT DOCUMENTS

| | | | |
|---|---|---|---|
| 6,342,898 B1 * | 1/2002 | Pettitt | H03M 7/30 345/600 |
| 6,756,955 B2 * | 6/2004 | Someya | G09G 3/2011 345/604 |

(Continued)

FOREIGN PATENT DOCUMENTS

| | | |
|---|---|---|
| CN | 101123074 | 2/2008 |
| CN | 101127907 A | 2/2008 |

(Continued)

OTHER PUBLICATIONS

Huang, CN102446479A, 2012, English Translation, pp. 1-40 (Year: 2012).*

*Primary Examiner* — Samantha (Yuehan) Wang
(74) *Attorney, Agent, or Firm* — Hemisphere Law, PLLC; Zhigang Ma (57) ABSTRACT

The disclosure provided a compressing method of the grayscale compensation table of an OLED display panel, which comprising: step 10, when transmitting a set of grayscale compensation table of the OLED display panel to an encoder for encoding, firstly, performing a differential calculation on many grayscale compensation tables with a same color channel and different gray scales in the set of which to (Continued)

acquire a corresponding reference image and a difference image as replacements of many grayscale compensation tables; step 20, transmitting the above images to the encoder; step 30, the encoder compressing and encoding a received grayscale compensation table. The compressing method of the grayscale compensation table of the OLED display panel performs the intra-level differences between the same color component and the different grayscale compensation tables in the same OLED compensation table to improve an efficiency and a performance of the compression compensation table.

11 Claims, 4 Drawing Sheets

(56) References Cited

U.S. PATENT DOCUMENTS

| | | | |
|---|---|---|---|
| 2010/0149207 A1* | 6/2010 | Madden | G09G 5/02 345/596 |
| 2013/0342585 A1* | 12/2013 | Chun | G09G 3/3208 345/690 |
| 2014/0306979 A1* | 10/2014 | Chun | G09G 3/12 345/589 |
| 2015/0339977 A1* | 11/2015 | Nathan | G01R 19/0092 345/78 |
| 2016/0071487 A1* | 3/2016 | Lu | G09G 3/3208 345/690 |
| 2016/0110856 A1* | 4/2016 | Hoof | H04N 5/243 382/283 |
| 2018/0240404 A1* | 8/2018 | Furihata | G09G 3/3258 |
| 2019/0182509 A1* | 6/2019 | Kim | H04N 19/12 |

FOREIGN PATENT DOCUMENTS

| | | | | |
|---|---|---|---|---|
| CN | 102446479 | | 5/2012 | |
| CN | 102446479 A | * | 5/2012 | ............... G09G 3/20 |
| CN | 104954797 | | 9/2015 | |
| CN | 105741762 | | 7/2016 | |
| CN | 107067445 | | 8/2017 | |
| KR | 20070099800 | | 10/2007 | |
| WO | WO-2019113791 A1 | * | 6/2019 | ............... G09G 3/36 |

\* cited by examiner

COMPRESSING METHOD OF A GRAYSCALE COMPENSATION TABLE OF AN OLED DISPLAY PANEL

RELATED APPLICATIONS

The present application is a National Phase of International Application Number PCT/CN2017/113685, filed on Nov. 30, 2017, and claims the priority of China Application 201711066079.8, filed on Nov. 2, 2017.

FIELD OF THE DISCLOSURE

The disclosure relates to a display technical field, and more particularly to a compressing method of a grayscale compensation table of an OLED display panel.

BACKGROUND

An organic light-emitting diode (OLED) display device with self-luminous, low driving voltage, high luminous efficiency, short response time, high definition and contrast, nearly 180° viewing angle, wide temperature range, flexible display and large area with full-color display and many other advantages, which is recognized as the most promising display device by an industry. The OLED display device can be divided into two types: a passive matrix OLED (PMOLED) and an active matrix OLED (AMOLED) according to a driving mode, wherein, AMOLED has a matrix arrangement of a pixel, belonging to the active display type, which is high luminous efficiency, and usually used for a high-definition large-size display device.

At present, in a production process of a flat display panel, a defect such as a brightness mura often occurred due to a production process and the like, appearing a bright or a dark spot, which leads to a decrease of the display quality of the panel. In order to eliminate the defect such as the brightness mura of the OLED display panel, but a compensation table is generally used in the prior art to store a compensation information of each pixel in the OLED display panel. When projecting an image, a driver board looks for the compensation table and adjusts a signal, which the signal in a dark area of the panel is raised and the signal in a bright area is lowered, showing an uniform display effect.

In the compensation table, each pixel corresponds to a set of the compensation information, and each set of the compensation information contains one or more compensation data, for the compensation table of grayscale, the compensation data is an adjustment value of a specific grayscale. In the prior art, a size of the compensation table is generally equal to a number of pixels multiplied by the size of each set of the compensation information, and the compensation table occupies a large amount of a system storage space.

The OLED display panel corresponds to a plurality of different color channels, different grayscale compensation tables. In order to save a cost and reduce a transmission time of a data, the compensation table needs to be compressed and stored first. For the grayscale compensation table, since the compensation data stored in the compensation table is the adjustment value of the specific grayscale, each grayscale compensation table actually corresponds to one image, and the compression of the grayscale compensation table is actually equal to the compression of the image.

Different grayscale compensation table is that there is the plurality of redundancy between images. For the same color channel, the redundancy between the images of different grayscale is particularly remarkable, a texture between the images is very similar. If there is a way to remove the redundancy between the different grayscale images, a compression efficiency of the grayscale compensation table can be greatly improved.

On the other hand, each grayscale compensation table will affect a compensation effect of a certain color channel and a certain grayscale. If there is an insufficient quality of the compensation table on a group of the grayscale compensation tables in the display panel, a panel quality will be affected.

An existing encoder supports an encoding of a color spaces which are 4:0:0, 4:2:2 and 4:4:4, and using of the existing encoders encodes the images, that is, grayscale compensation table, can achieve a purpose of compressing grayscale compensation table. However, a configuration used in the prior art for encoding the grayscale compensation table is all intra, that is, an all-intra coding is performed on each compensation table. When encoding the grayscale compensation table, each compensation table is independent, and there is no relation between the compensation table and the compensation table. When encoding, only an all-intra prediction module is used to reduce an all-intra redundancy. It does not consider the redundancy between different compensation tables. Moreover, when setting a quantization coefficient (QP), only the compression effect of the compensation table is taken as the purpose, and an optimization of an overall purpose is not taken into consideration. In fact, only a set of the compensation table of all the images achieving the quality standard, the quality of the display panel is guaranteed. In short, the defects of a conventional compressing method of the grayscale compensation table of the OLED display panel is that the redundancy between the images is not taken into account when compressing each image; when setting the quantization coefficient (QP), it does not take into account the overall optimum performance of the compression of the plurality of compensation tables.

SUMMARY

Therefore, a purpose of the present disclosure is to provide a compressing method of a grayscale compensation table of an OLED display panel. In a same set of the OLED compensation table, as much as possible to eliminate a same color channel, and a redundancy between different grayscale images to improve an efficiency and a performance of the compression compensation table.

To realize an above purpose, the present disclosure provides the compressing method of the grayscale compensation table of the OLED display panel, comprising:

Step 10, when transmitting a set of grayscale compensation table of the OLED display panel to an encoder for encoding, firstly, performing a differential calculation on a plurality of grayscale compensation tables with a same color channel and different gray scales in the set of grayscale compensation table to acquire a corresponding reference image and a difference image as replacements of the plurality of grayscale compensation tables;

Step 20, transmitting the corresponding reference image and the difference image as the replacements of the plurality of grayscale compensation tables to the encoder;

Step 30, the encoder compressing and encoding a received grayscale compensation table.

Wherein, in the step 30, when the encoder encodes and compresses, adaptively adjusting a quantification coefficient of each compensation table: in the premise of meeting an overall compression rate, making a quality of each compensation table reach an expectation, or the quality of each compensation table close before and after encoding.

Wherein, in the step 10, taking one of N grayscale compensation tables having the same color channel and different gray scales as the reference image, and the other N−1 grayscale compensation tables are performing the differential calculation.

Wherein, in the step 10, dividing N grayscale compensation tables having the same color channel and different gray scales into M groups, where M≤N/2, each group has N/M grayscale compensation tables, and performing a following process to each grayscale compensation table in each group: taking one of the grayscale compensation table as the reference image, and the other N/M−1 grayscale compensation tables are performing the differential calculation.

Wherein, in the step 10, taking one of N grayscale compensation tables having the same color channel and different gray scales as the reference image, and the other N−1 grayscale compensation tables are performing the differential calculation to acquire N−1 difference images; and taking one of the N−1 differential images as a reference, and performing the differential calculation to the other N−2 differential images again.

Wherein, further comprising: when decoding, the corresponding reference image and the difference image are acquired, the corresponding reference image and the difference image are added to each other to acquire a decompressed grayscale compensation table.

Wherein the decompressed grayscale compensation table is set to meet a condition A or B as follows: where when all image quality is greater than Vg, a condition is recorded as A; and in all images, when a difference between a best quality and a worst quality is less than Vt, a condition is recorded as B; and the step 30 comprises:

a) initiating the quantification coefficient;

b) increasing the quantization coefficient if an actual compression ratio>a default compression ratio during the compressing and encoding, if not, decreasing the quantization coefficient; repeating such encoding until the quantization coefficient=$Qp_{base}$ to satisfy the actual compression ratio≤the default compression ratio, when the quantization coefficient=$Qp_{base}-1$, and the actual compression ratio>the default compression ratio, stopping circulate; and exiting the encoding if all the decompressed compensation tables satisfy the condition A or B;

c) or setting a threshold value 1:

I. ranking the encoding quality from small to large in orders, the encoding quality after ranking is evaluated as V1, V2, V3 . . . VN (V1<V2< . . . <VN), corresponding compensation tables are G1, G2 . . . GN; assuming in this encoding quality assessment method, the smaller the V value, the higher the quality;

II. based on the compensation table $G_{N/2}$ with a medium encoding quality, the N compensation tables are divided into three categories; if $V_i<V_{N/2}$−value1, the image is placed in a α category; if $V_{N/2}$−value1≤V≤$V_{N/2}$+value1, the image is placed in a β category, and if $V_i>V_{N/2}$+value1, the image is placed in a γ category; where the encoding quality of the compensation table in the category α is the best; the encoding quality of the compensation table in the category β is medium; and the encoding quality of the compensation table in the category γ is the worst;

III. reducing the quantization coefficient of the compensation table in the category γ, and increasing the quantization coefficient of the compensation table in the category α, and the quantization coefficient of the compensation table in the category β remains unchanged, and performing re-encoding;

repeating steps b)~c) until the conditions A or B are met, and exiting the encoding.

Wherein, the image quality is measured in terms of a peak signal-to-noise ratio.

Wherein, the quantification coefficient is initialized as 10.

The present disclosure further provides the compressing method of the grayscale compensation table of the OLED display panel, comprising:

Step 10, when transmitting the set of grayscale compensation table of the OLED display panel to the encoder for encoding, firstly, performing the differential calculation on the plurality of grayscale compensation tables with the same color channel and different gray scales in the set of grayscale compensation table to acquire the corresponding reference image and the difference image as replacements of the plurality of grayscale compensation tables;

Step 20, transmitting the corresponding reference image and the difference image as the replacements of the plurality of grayscale compensation tables to the encoder;

Step 30, the encoder compressing and encoding the received grayscale compensation table;

Wherein in the step 30, when the encoder encodes and compresses, adaptively adjusting the quantification coefficient of each compensation table: in the premise of meeting the overall compression rate, making the quality of each compensation table reach the expectation, or the quality of each compensation table close before and after encoding;

Further comprising: further comprising: when decoding, the corresponding reference image and the difference image are acquired, the corresponding reference image and the difference image are added to each other to acquire the decompressed grayscale compensation table;

Wherein the decompressed grayscale compensation table is set to meet the condition A or B as follows: where when all image quality is greater than Vg, the condition is recorded as A; and in all images, when the difference between the best quality and the worst quality is less than Vt, a condition is recorded as B; and the step 30 comprises:

a) initiating the quantification coefficient;

b) increasing the quantization coefficient if the actual compression ratio>a default compression ratio during the compressing and encoding, if not, decreasing the quantization coefficient; repeating such encoding until the quantization coefficient=$Qp_{base}$ to satisfy the actual compression ratio≤the default compression ratio, when the quantization coefficient=$Qp_{base}-1$, and the actual compression ratio>the default compression ratio, stopping circulate; and exiting the encoding if all the decompressed compensation tables satisfy the condition A or B;

c) or setting a threshold value 1:

I. ranking the encoding quality from small to large in orders, the encoding quality after ranking is evaluated as V1, V2, V3 . . . VN (V1<V2< . . . <VN), corresponding compensation tables are G1, G2 . . . GN; assuming in this encoding quality assessment method, the smaller the V value, the higher the quality;

II. based on the compensation table $G_{N/2}$ with the medium encoding quality, the N compensation tables are divided into three categories; if $V_i<V_{N/2}$−value1, the image is placed in the α category; if $V_{N/2}$−value1≤$V_i$≤$V_{N/2}$+value1, the image is placed in the β category, and if $V_i>V_{N/2}$+value1, the image is placed in the γ category; where the encoding quality of the compensation table in the category α is the best; the encoding quality of the compensation table in the category β is medium; and the encoding quality of the compensation table in the category γ is the worst;

III. reducing the quantization coefficient of the compensation table in the category γ, and increasing the quantization coefficient of the compensation table in the category α, and the quantization coefficient of the compensation table in the category β remains unchanged, and performing re-encoding;

repeating steps b)~c) until the conditions A or B are met, and exiting the encoding.

Wherein, the image quality is measured in terms of the peak signal-to-noise ratio.

In short, in the compressing method of the grayscale compensation table of the OLED display panel of the present disclosure in the same set of OLED compensation tables, and differentiating an intra-level between a same color component and different grayscale compensation table to improve the efficiency and performance of the compressing compensation table; and adaptively adjusting the quantification coefficient of each compensation table, in the premise of meeting the overall compression rate, making the quality of each compensation table before and after coding reach the expected, or the quality of each compensation table close.

BRIEF DESCRIPTION OF THE DRAWINGS

The technical solutions of the present disclosure and other beneficial effects will be apparent from the following detailed description of specific embodiments of the present invention with reference to the accompanying figures. In the figures.

DETAILED DESCRIPTION OF PREFERRED EMBODIMENTS

Figure 1:
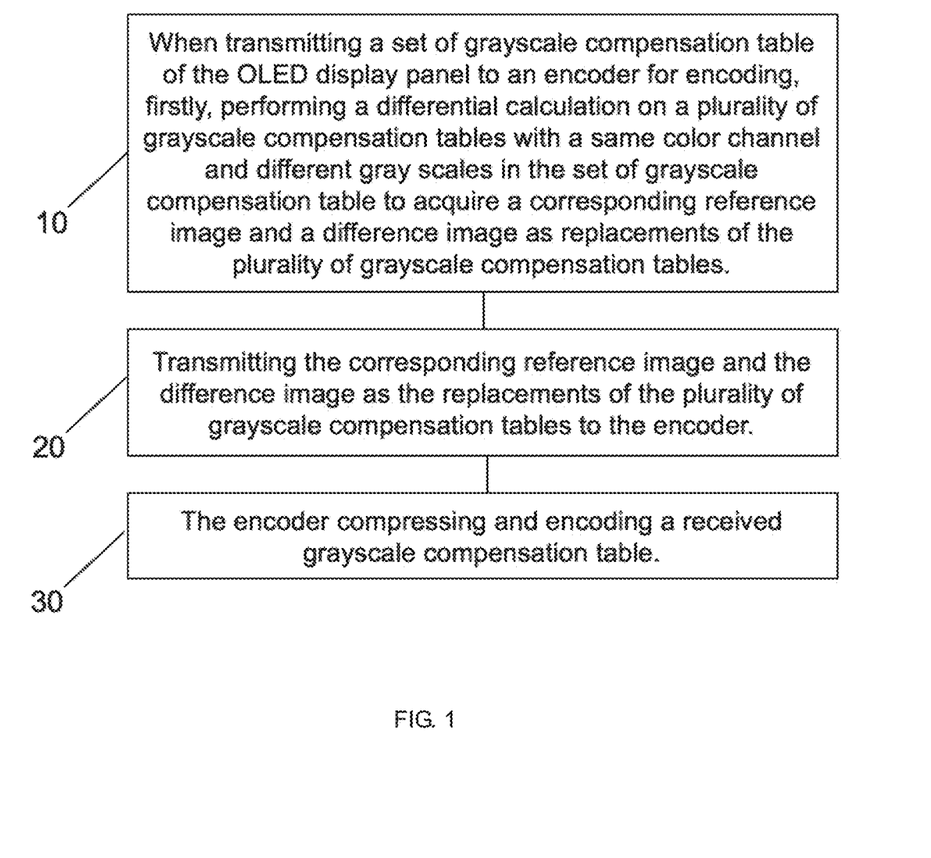
FIG. 1 is a flow chart of a compressing method of a grayscale compensation table of an OLED display panel of the disclosure.

See FIG. 1, a flow chart of a compressing method of a grayscale compensation table of an OLED display panel of the disclosure, the disclosure mainly comprises:

Step 10, when transmitting a set of grayscale compensation table of the OLED display panel to an encoder for encoding, firstly, performing a differential calculation on a plurality of grayscale compensation tables with a same color channel and different gray scales in the set of grayscale compensation table to acquire a corresponding reference image and a difference image as replacements of the plurality of grayscale compensation tables;

Step 20, transmitting the corresponding reference image and the difference image as the replacements of the plurality of grayscale compensation tables to the encoder;

Step 30, the encoder compressing and encoding a received grayscale compensation table.

Figure 2:
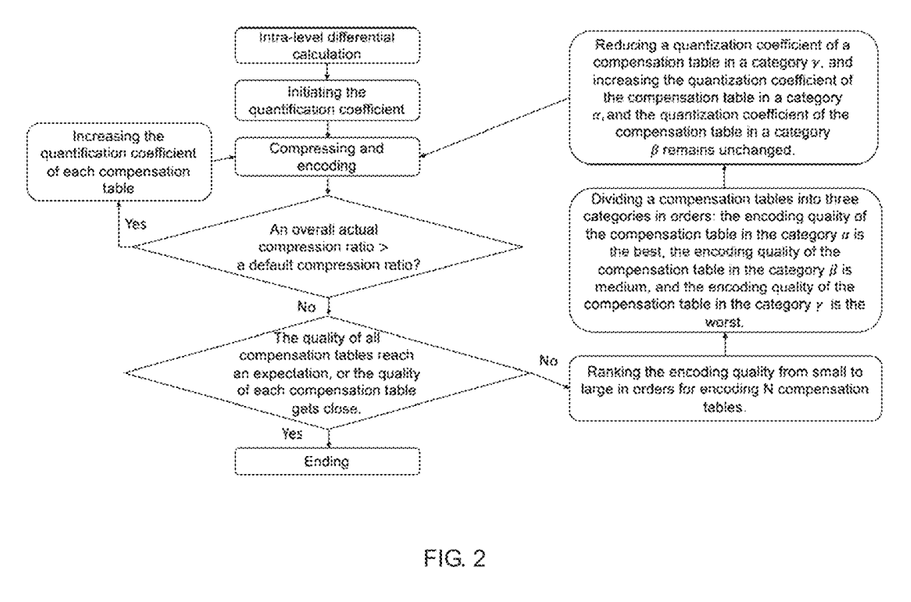
FIG. 2 is a flow chart of an overall algorithm of a preferred embodiment of a compressing method of a grayscale compensation table of an OLED display panel of the disclosure.
Figure 3:
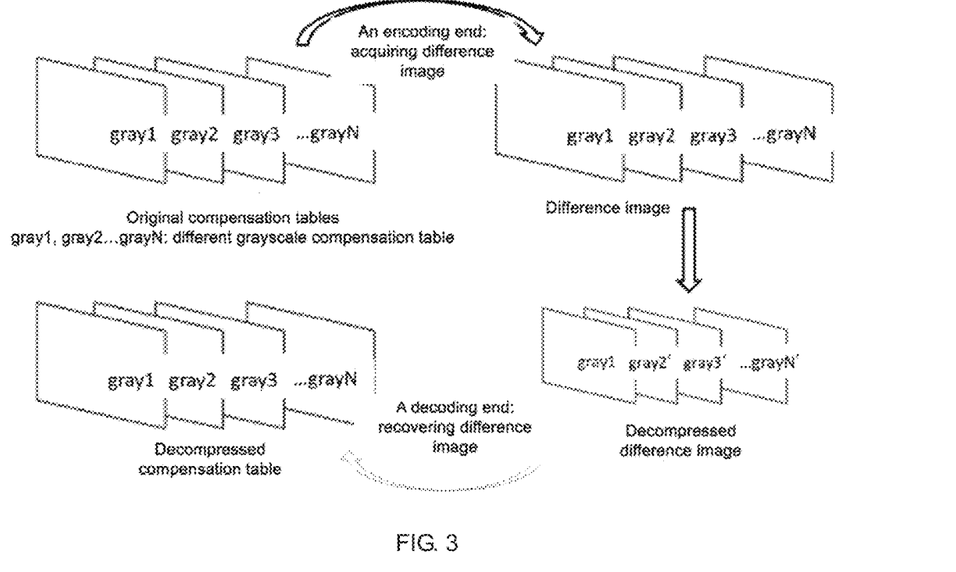
FIG. 3 is a schematic diagram of performing a differential coding on a compensation table of a preferred embodiment of a compressing method of a grayscale compensation table of an OLED display panel of the disclosure.

See FIG. 2, a flow chart of an overall algorithm of a preferred embodiment of the compressing method of the grayscale compensation table of the OLED display panel of the disclosure; FIG. 3 is a schematic diagram of performing a differential coding on a compensation table of the preferred embodiment.

In a same set of the OLED compensation table of the disclosure, as much as possible to eliminate a same color channel, and a redundancy between the different grayscale images to improve an efficiency and a performance of the compression compensation table. At an encoding end, adaptively adjusting a quantization coefficient of each compensation table and making an overall compression rate achieve a standard, while optimizing an overall image quality.

The OLED panel corresponds to a plurality of the compensation tables. Firstly, performing the differential calculation on N grayscale compensation tables with the same color channel and the different gray scale, then transmitting a reference and a difference component to an encoding module, and iteratively adjusting a quantization coefficients until the overall compression rate reaches a preset condition, and making an image quality of each compensation table reach the standard, or the difference between the image quality of each compensation table is less than a threshold.

Taking N images of the same color channel and the different grayscales in a set of the OLED compensation table performs the differential calculation:

Optionally, on the encoding end, taking one of the images as the reference image, and the other N−1 grayscale compensation tables are performing the differential calculation. After a decoding end decodes, recovering a difference image and the reference image and adding the images together to acquire a decoded image.

Optionally, dividing these compensation tables into M groups, M≤N/2, which each group has N/M compensation tables. The encoding end performs a following processing for each group of compensation table: taking one of the images as the reference image, and the other N/M−1 images are performing the differential calculation. After a decoding end decodes, recovering the difference image and adding the corresponding reference image together to acquire the decoded image.

Optionally, on the encoding end, taking one of the images as the reference image, and the other N−1 grayscale compensation tables are performing the differential calculation; and taking another one of the N−1 difference images as the reference image, and the remaining N−2 images are performing the differential calculation again. After a decoding end decodes, recovering the N−2 difference image firstly and then recovering the N−1 difference image to acquire the decoded image.

When N compensation tables encoding, it adaptively adjusted the quantization coefficient. Firstly, the decompressed grayscale compensation table is set to meet a condition A or B as follows: where when all image quality is greater than Vg, a condition is recorded as A; and in all images, when a difference between a best quality and a worst quality is less than Vt, a condition is recorded as B.

a) initiating the quantification coefficient;

b) when compressing and encoding, increasing the quantization coefficient if an actual compression ratio>a default compression ratio; if not, decreasing the quantization coefficient. Repeating such encoding until the quantization coefficient=$Qp_{base}$ to satisfy the actual compression ratio≤the default compression ratio, when the quantization coefficient=$Qp_{base}$−1, and the actual compression ratio>the default compression ratio, stopping circulate; and exiting the encoding if all the decompressed compensation tables satisfy the condition A or B;

c) or setting a threshold value 1:
  I. ranking the encoding quality from small to large in orders, the encoding quality after ranking is evaluated as V1, V2, V3 . . . VN (V1<V2< . . . <VN), corresponding compensation tables are G1, G2 . . . GN; assuming in this encoding quality assessment method, the smaller the V value, the higher the quality;
  II. based on the compensation table $G_{N/2}$ with a medium encoding quality, the N compensation tables are divided into three categories; if $V_i<V_{N/2}$−value1, the image is placed in a α category; if $V_{N/2}$−value1≤$V_i$≤$V_{N/2}$+value1, the image is placed in a β category, and if $V_i>V_{N/2}$+value1, the image is placed in a γ category; where the encoding quality of the compensation table in the category α is the best; the encoding quality of the compensation table in the category β is medium; and the encoding quality of the compensation table in the category γ is the worst;
  III. reducing the quantization coefficient of the compensation table in the category γ, and increasing the quantization coefficient of the compensation table in the category α, and the quantization coefficient of the compensation table in the category β remains unchanged, and performing re-encoding;

repeating steps b)~c) until the conditions A or B are met, and exiting the encoding. In this case, an overall compression performance of the N compensation tables can be guaranteed to be optimal.

1) The following example illustrates a calculation step of the differential calculation of an intra-level (with three compensation tables as an example):
  ① Taking an image gray1 as the example, and describing a process of acquiring a difference image gray1':
  Firstly, a calculating average of a gray1, gray2 is recorded as a mean(gray1), mean(gray2), respectively. Performing the differential calculation according to formula (1) on each pixel value gray1, (setting a resolution ratio of the compensation table is width×height, width>i≥0, height>j≥0).

$$\text{gray1}(i,j)=\text{gray2}(i,j)+\text{mean(gray1)}-\text{mean(gray2)}-\text{gray1}(i,j) \quad (1)$$

Taking a minimum of the gray1, and recording as gray_min. At the same time, the pixel value of a gray1 image, which is positive but also negative. Therefore, according to gray1 formula (2), adjusting and ensuring that each pixel in the gray1 image is not less than 0.

$$\text{gray1}(i,j)'=\text{gray1}(i,j)-\text{gray\_min} \quad (2)$$

Addressing all the pixel values of the gray1 to acquire the differential image gray1' of the gray1 (similar to the process of acquiring the gray2').
For the gray1, it recorded as diff_val=mean(gray1)−mean(gray2)−gray_min, which the formula (1) and formula (2) are equal to the formula (3).

$$\text{gray1}(i,j)'=\text{gray2}(i,j)-\text{gray1}(i,j)+\text{diff\_va} \quad (3)$$

② According to a HEVC encoding process, encoding gray2, gray1', gray3', respectively. Encoding of the two images of a gray1', gray3' to encode a parameter diff_val.
③ Interpreting diff_val from a code stream on the decoding end and decoding it to acquire a compressed image gray2, gray1', gray3'.

$$\text{gray1}(i,j)=\text{gray2}(i,j)-\text{gray1}(i,j)'+\text{diff\_va} \quad (4)$$

④ Adjusting an order of an image output, and finally getting the decompressed compensation table image gray1, gray2, gray3.

Figure 4A:
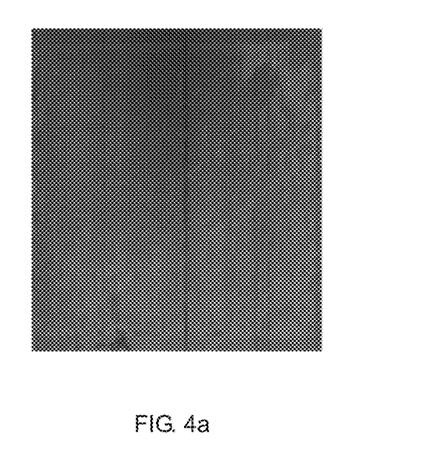
FIG. 4a, 4b, 4c are schematic diagrams of a grayscale compensation table, which is oled_2_024, oled_2_064 and the difference images between the two images.
Figure 4B:
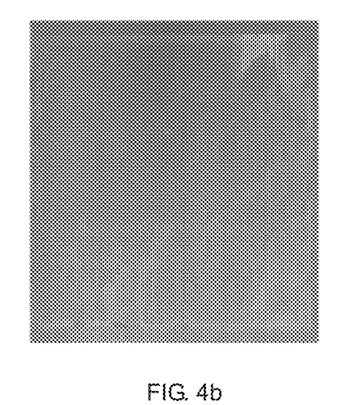
Figure 4C:
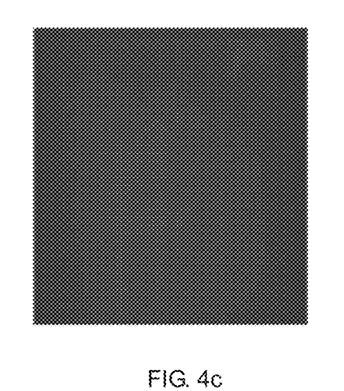

FIGS. 4a, 4b and 4c show the grayscale compensation tables oled_2_024, oled_2_064 and these two difference images, respectively, which are differentiated between the compensation tables to remove a high-frequency component. It is observed that the difference image of oled_2_024 has been reduced much information compared to an original image; therefore, when it is compressed, the benefit of the coding increases a lot naturally.

The following specific test is to verify the compression performance of the difference between the compression table of the present disclosure.

A sequence of the test is the 4 sets of the OLED panels, oled3, oled6, oled9 and oled12 (the numbers are used to distinguish a dimension of the OLED panel), and the 4 sets of the OLED compensation tables are composed of the 4 kinds of chrominance components (R, G, B, W) and 3 kinds of grayscales, and each chrominance component corresponds to 3 kinds of grayscales, which the total is 12 compensation table images. Wherein, the resolution ratio of the oled3 is 1920×2160, and the resolution ratio of the oled6, oled9, oled12 is 1080×1920. The results of the compression performance are shown in Table 1.

| Sequence | BD-rate |
| --- | --- |
| oled3 | −15.3% |
| oled6 | −9.6% |
| oled9 | −20.0% |
| oled12 | −12.1% |
| Average | −14.2% |

As it can be seen from Table 1, when using grayscale differential coding on the 4 sets of the OLED compensation tables according to the disclosure, the BD-rate (a coding ratio under the same quality) is reduced by 14.2% on average, and the benefit of the coding is considerable.

2) The following example illustrates the adaptively adjustment of the compensation table QP of the disclosure, and the steps are briefly described as follows:
  When encoding N compensation table images, the quantization coefficient is adaptively adjusted. If each image after compression is met the PSNR≥50, which a condition is recorded as A; if the ΔPSNR≤2 between the images after compression (ΔPSNR is the difference of the PSNR between different images), which a condition is recorded as B; if the default compression ratio=35%, then compressing the image to 35% of the original image.
  ① If the quantification coefficient is initialized as 10.
  ② When compressing and encoding, increasing the quantization coefficient if the actual compression ratio >35%. Repeating such encoding until the quantization coefficient=$Qp_{base}$ to satisfy the actual compression ratio ≤35%, and stopping to circulate. Exiting the encoding if all the compressed compensation tables satisfy the condition A.

③ Or (setting the optimal threshold value1 and supposing the value1=2):
  I. Ranking the encoding quality from small to large in orders (the first compensation table has the best coding quality and the last one has the worst coding quality), the encoding quality after ranking is evaluated as V1, V2, V3 . . . VN (V1<V2< . . . <VN), corresponding compensation tables are G1, G2 . . . GN.
  II. Based on the compensation table $G_{N/2}$ with a medium encoding quality, a total of N compensation tables are divided into three categories; if $V_i<V_{N/2}-2$, the image is placed in a α category; if $V_{N/2}-2 \leq V_i \leq V_{N/2}+2$, the image is placed in a β category, if $V_i>V_{N/2}+2$, the image is placed in a γ category; where the encoding quality of the compensation table in the category α is the best; the coding quality of the compensation table in the category β is medium; and the coding quality of the compensation table in the category γ is the worst.
  III. Reducing the quantization coefficient of the compensation table in the category γ, because the quality is the worst; and increasing the quantization coefficient of the compensation table in the category α, because the quality is the best; and the quantization coefficient of the compensation table in the category β remains unchanged, and performing re-encoding.

If at this time: the PSNR>54 of the compensation table in the category α; the PSNR<50 of the compensation table in the category γ; and 50≤PSNR≤54 of the compensation table in the category β. It will take such a strategy to adjust the quantization coefficient: increasing the quantization coefficient of the compensation table in the category α, reducing the compensation table in the category γ, and the quantization coefficient of the compensation table in the category β remains unchanged.

④ Repeating steps ②~③ until the conditions A or B are met, and exiting the code. In this case, the overall compression performance of the N compensation tables can be guaranteed to be optimal.

In short, the compressing method of the grayscale compensation table of the OLED display panel of the disclosure performs the intra-level differences between the same color component and the different grayscale compensation tables in the same OLED compensation table to improve the efficiency and the performance of the compression compensation table; and adaptively adjusting the quantification coefficient of each compensation table, in the premise of meeting the overall compression ratio, making the quality of each compensation table before and after coding reach the expected, or the quality of each compensation table close.

It should be understood by those skilled in the art that various modifications and variations can be made in the light of the technical solutions and technical concepts of the disclosure and all such modifications and variations shall fall within the protection scope of the appended claims of the present invention.

What is claimed is:

1. A compressing method of a grayscale compensation table of an OLED display panel, comprising:
  step 10, when transmitting a set of grayscale compensation table of the OLED display panel to an encoder for encoding, firstly, performing a differential calculation on a plurality of grayscale compensation tables with a same color channel and different gray scales in the set of grayscale compensation table to acquire a corresponding reference image and a difference image as replacements of the plurality of grayscale compensation tables;
  step 20, transmitting the corresponding reference image and the difference image as the replacements of the plurality of grayscale compensation tables to the encoder;
  step 30, the encoder compressing and encoding a received grayscale compensation table;
  wherein, in the step 30, when the encoder encodes and compresses, adaptively adjusting a quantification coefficient of each compensation table: in the premise of meeting an overall compression rate, making a quality of each compensation table reach the expectation, or the quality of each compensation table close before and after coding;
  when decoding, the corresponding reference image and the difference image are acquired, the corresponding reference image and the difference image are added to each other to acquire a decompressed grayscale compensation table;
  wherein, the decompressed grayscale compensation table is set to meet a condition A or B as follows: where when all an image quality is greater than Vg, which a condition is recorded as A;
  and in all images, when a difference between a best quality and a worst quality is less than Vt, a condition is recorded as B; and the step 30 comprises:
  a) initiating the quantification coefficient;
  b) increasing the quantization coefficient if an actual compression ratio ≥a default compression ratio during the compressing and encoding; if not, decreasing the quantization coefficient; repeating such coding until the quantization coefficient=$Qp_{base}$ to satisfy the actual compression ratio ≤the default compression ratio; when the quantization coefficient=$QP_{base}-1$, and the actual compression ratio ≥the default compression ratio, stopping circulating; and exiting the encoding if all the decompressed compensation tables satisfy the condition A or B;
  c) or setting a threshold value 1:
    I. ranking the encoding quality from small to large in orders, the encoding quality after ranking is evaluated as V1, V2, V3 . . . VN (V1<V2< . . . <VN), corresponding compensation tables are G1, G2 . . . GN; assuming in this encoding quality assessment method, the smaller the V value, and the higher the quality;
    II. based on the compensation table $G_{N/2}$ with a medium encoding quality, the N compensation tables are divided into three categories; if $V_i<V_{N/2}$-value1, the image is placed in a α category; if $V_{N/2}$-value1≤$V_i$≤$V_{N/2}$ + value1, the image is placed in a β category, and if $V_i>V_{N/2}$ + value1, the image is placed in a γ category; where the encoding quality of the compensation table in the category α is the best the encoding quality of the compensation table in the category β is medium; and the encoding quality of the compensation table in the category γ is the worst;
    III. reducing the quantization coefficient of the compensation table in the category γ, and increasing the quantization coefficient of the compensation table in the category α, and the quantization coefficient of the compensation table in the category β remains unchanged, and performing re-encoding;

repeating steps b)~c) until the conditions A or B are met, and exiting the encoding.

2. The compressing method of a grayscale compensation table of an OLED display panel according to claim 1, wherein, in the step 10, taking one of N grayscale compensation tables having the same color channel and different gray scales as the reference image, and the other N−1 grayscale compensation tables are performing the differential calculation.

3. The compressing method of a grayscale compensation table of an OLED display panel according to claim 1, wherein, in the step 10, dividing N grayscale compensation tables having the same color channel and different gray scales, dividing it into M groups, where M≤N/2, which each group has N/M grayscale compensation tables, and performing a following process ro each grayscale compensation table in each group: taking one of the grayscale compensation table as the reference image, and the other N/M−1 grayscale compensation tables are performing the differential calculation.

4. The compressing method of a grayscale compensation table of an OLED display panel according to claim 1, wherein, in the step 10, taking one of N grayscale compensation tables having the same color channel and different gray scales as the reference image, and the other N−1 grayscale compensation tables are performing the differential calculation to acquire N−1 difference images; and taking one of the N−1 differential images as a reference, and performing the differential calculation to the other N−2 differential images again.

5. The compressing method of a grayscale compensation table of an OLED display panel according to claim 1, wherein the image quality is measured in terms of a peak signal-to-noise ratio.

6. The compressing method of a grayscale compensation table of an OLED display panel according to claim 1, wherein the quantification coefficient is initialized as 10.

7. A compressing method of a grayscale compensation table of an OLED display panel, comprising:
step 10, when transmitting a set of grayscale compensation table of the OLED display panel to an encoder for encoding, firstly, performing a differential calculation on a plurality of grayscale compensation tables with a same color channel and different gray scales in the set of grayscale compensation table to acquire a corresponding reference image and a difference image as replacements of the plurality of grayscale compensation tables;
step 20, transmitting the corresponding reference image and the difference image as the replacements of the plurality of grayscale compensation tables to the encoder;
step 30, the encoder compressing and encoding a received grayscale compensation table;
in the step 30, when the encoder encodes and compresses, adaptively adjusting a quantification coefficient of each compensation table: in the premise of meeting an overall compression rate, making a quality of each compensation table reach an expectation, or the quality of each compensation table close before and after encoding;
when decoding, the corresponding reference image and the difference image are acquired, the corresponding reference image and the difference image are added to each other to acquire a decompressed grayscale compensation table;
wherein the decompressed grayscale compensation table is set to meet a condition A or B as follows: where when all image quality is greater than Vg, a condition is recorded as A; and in all images, when a difference between a best quality and a worst quality is less than Vt, a condition is recorded as B; and the step 30 comprises:
a) Initiating the quantification coefficient;
b) increasing the quantization coefficient if an actual compression ratio >a default compression ratio during the compressing and encoding, if not, decreasing the quantization coefficient; repeating such encoding until the quantization coefficient=$Qp_{base}$ to satisfy the actual compression ratio ≤the default compression ratio, when the quantization coefficient=$Qp_{base}$−1, and the actual compression ratio >the default compression ratio, stopping circulate; and exiting the encoding if all the decompressed compensation tables satisfy the condition A or B;
c) or setting a threshold value 1:
I. ranking the encoding quality from small to large in orders, the encoding quality after ranking is evaluated as V1, V2, V3 . . . VN (V1<V2< . . . <VN), corresponding compensation tables are G1, G2 . . . GN; assuming in this encoding quality assessment method, the smaller the V value, the higher the quality;
II. based on the compensation table $G_{N/2}$ with a medium encoding quality, the N compensation tables are divided into three categories; if $V_i<V_{N/2}$−value1, the image is placed in a α category; if $V_{N/2}$−value1≤$V_i$≤$V_{N/2}$+value1, the image is placed in a β category, and if $V_i>V_{N/2}$+value1, the image is placed in a γ category; where the encoding quality of the compensation table in the category α is the best; the encoding quality of the compensation table in the category β is medium; and the encoding quality of the compensation table in the category γ is the worst;
III. reducing the quantization coefficient of the compensation table in the category γ, and increasing the quantization coefficient of the compensation table in the category α, and the quantization coefficient of the compensation table in the category β remains unchanged, and performing re-encoding;
repeating steps b)~c) until the conditions A or B are met, and exiting the encoding;
wherein the image quality is measured in terms of a peak signal-to-noise ratio.

8. The compressing method of a grayscale compensation table of an OLED display panel according to claim 7, wherein, in the step 10, taking one of N grayscale compensation tables having the same color channel and different gray scales as the reference image, and the other N−1 grayscale compensation tables are performing the differential calculation.

9. The compressing method of a grayscale compensation table of an OLED display panel according to claim 7, wherein, in the step 10, dividing N grayscale compensation tables having the same color channel and different gray scales into M groups, where M≤N/2, each group has N/M grayscale compensation tables, and performing a following process to each grayscale compensation table in each group: taking one of the grayscale compensation table as the reference image, and the other N/M−1 grayscale compensation tables are performing the differential calculation.

10. The compressing method of a grayscale compensation table of an OLED display panel according to claim 7, wherein, in the step 10, taking one of N grayscale compensation tables having the same color channel and different gray scales as the reference image, and the other N−1 grayscale compensation tables are performing the differential calculation to acquire N−1 difference images; and taking one of the N−1 differential images as a reference, and performing the differential calculation to the other N−2 differential images again.

11. The compressing method of a grayscale compensation table of an OLED display panel according to claim 7, wherein, the quantification coefficient is initialized as 10.

* * * * *